United States Patent
Deng et al.

(10) Patent No.: US 11,853,127 B2
(45) Date of Patent: Dec. 26, 2023

(54) DISPLAY PANEL AND DISPLAY DEVICE

(71) Applicant: Xiamen Tianma Micro-Electronics Co., Ltd., Xiamen (CN)

(72) Inventors: Zhuo Deng, Xiamen (CN); Poping Shen, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 145 days.

(21) Appl. No.: 17/523,934

(22) Filed: Nov. 11, 2021

(65) Prior Publication Data

US 2022/0066517 A1 Mar. 3, 2022

(30) Foreign Application Priority Data

Aug. 31, 2021 (CN) .......................... 202111013769.3

(51) Int. Cl.
*H01L 27/12* (2006.01)
*G06F 1/16* (2006.01)

(52) U.S. Cl.
CPC .......... *G06F 1/1656* (2013.01); *H01L 27/124* (2013.01)

(58) Field of Classification Search
CPC . H01L 27/124; G02F 1/13394; G02F 1/1345; G02F 1/13452; G02F 1/13454; G02F 1/13456; G02F 1/13458
See application file for complete search history.

(56) References Cited

U.S. PATENT DOCUMENTS

| 2015/0131025 A1* | 5/2015 | Ota ................... G02F 1/133512 349/110 |
| 2018/0257974 A1 | 9/2018 | Deng et al. |
| 2021/0208462 A1 | 7/2021 | Wu |
| 2022/0066259 A1 | 3/2022 | Cao et al. |

FOREIGN PATENT DOCUMENTS

| CN | 104730777 A | 6/2015 |
| CN | 204557445 U | 8/2015 |
| CN | 106249964 A | 12/2016 |
| CN | 106873251 A | 6/2017 |
| CN | 107290901 A | 10/2017 |
| CN | 206557508 U | 10/2017 |
| CN | 111025784 A | 4/2020 |
| CN | 111929951 A | 11/2020 |

* cited by examiner

*Primary Examiner* — James A Dudek
(74) *Attorney, Agent, or Firm* — KILPATRICK TOWNSEND & STOCKTON, LLP

(57) ABSTRACT

A display panel and a display device are provided. A first main support column and an auxiliary support column are provided between the first substrate and the second substrate in the frame area, and a length of the first main support column is greater than a length of the auxiliary support column. The second substrate includes the base, and further includes the first surface and the second surface located on a side of the second substrate facing the first substrate in the frame area. A height from the second surface to the base is greater than a height from the first surface to the base. An orthographic projection of the first main support column on the base is located within an orthographic projection of the first surface on the base.

19 Claims, 21 Drawing Sheets

DISPLAY PANEL AND DISPLAY DEVICE

The present application claims priority to Chinese Patent Application No. 202111013769.3, titled "DISPLAY PANEL AND DISPLAY DEVICE", filed on Aug. 31, 2021 with the China National Intellectual Property Administration, which is incorporated herein by reference in its entirety.

FIELD

The present disclosure relates to the field of display technology, and in particular, to a display panel and a display device.

BACKGROUND

With the continuous development of display technology, the application of display panels becomes more and more extensive, and users have higher and higher requirements for the display effect of the display panel. In the conventional technology, when the display panel performs the display, the display panel close to a part of the frame area has poor display problems, such as yellow display, which seriously affects the display quality of the user's display panel.

SUMMARY

In view of this, a display panel and a display device are provided according to the present disclosure, which effectively solves the problems existing in the conventional technology, solves the poor display problems, such as yellow display, on the display panel close to a part of the frame area, and improves the display effect of the display panel.

A display panel is provided according to the present disclosure. The display panel includes a first substrate, and a second substrate opposite to the first substrate. The display panel is divided into a display area and a frame area located at a periphery of the display area. Multiple first main support columns and multiple auxiliary support columns are arranged in the frame area, and a length of one first main support column is greater than a length of one auxiliary support column in a light emitting direction of the display panel. The multiple first main support columns are located on a side of the first substrate facing the second substrate. The second substrate includes a base, a first surface and a second surface. The first surface and the second surface are located on a side of the second substrate facing the first substrate, and a height from the second surface to the base is greater than a height from the first surface to the base. Orthographic projections of the multiple first main support column on the base are within an orthographic projection of the first surface on the base.

A display device is further provided according to the present disclosure. The display device includes the above-mentioned display panel.

Compared with the conventional technology, the embodiments provided in the present disclosure have at least the following advantages.

A display panel and a display device are provided according to the present disclosure. The first main support column and the auxiliary support column are provided between the first substrate and the second substrate in the frame area, and the length of the first main support column is greater than the length of the auxiliary support column. The second substrate includes the base, and further includes the first surface and the second surface which are located on a side of the second substrate facing the first substrate in the frame area. The height from the second surface to the base is greater than the height from the first surface to the base. In the embodiments provided in the present disclosure, the orthographic projection of the first main support column on the base is located within the orthographic projection of the first surface on the base, so that the first main support column is opposite to a concave area of the surface of the second substrate facing the first substrate side. In this way, a situation that a larger cell thickness between the first substrate and the second substrate is formed by the first main support column with a longer length, is improved. Therefore, the high thickness uniformity of the display panel is ensured, the poor display problems, such as yellow display, on the display panel close to a part of the frame area is solved, and the display effect of the display panel is improved.

BRIEF DESCRIPTION OF THE DRAWINGS

To illustrate the embodiments of the present disclosure more clearly, the following briefly describes the drawings according to embodiments of the present disclosure. Apparently, the drawings are only some embodiments of the present disclosure.

DETAILED DESCRIPTION OF EMBODIMENTS

The embodiments of the disclosure will be illustrated clearly and completely in conjunction with the drawings of the embodiments of the disclosure. Apparently, the described embodiments are only a few embodiments rather than all embodiments of the disclosure.

As described in the background, with the continuous development of display technology, the application of display panels becomes more and more extensive, and users have higher and higher requirements for the display effect of the display panel. In the conventional technology, when the display panel performs the display, the display panel close to a part of the frame area has poor display problems, such as yellow display, which seriously affects the display quality of the user's display panel, and becomes one of the problems to be solved urgently.

In an embodiment, for example, in a vehicle-mounted touch display device, the designs of the support columns in the frame area and the support columns in the display area tend to be consistent. For example, the size and density of the support columns in the frame area are consistent with those of the same type of support columns in the display area. In the display device, due to the high density of signal wirings in the frame area of the array substrate, the part of the surface of the array substrate facing the support column in the frame area is convex towards the support column, which is higher than the part of the surface in the display area. Therefore, the support columns in the frame area are in contact with the convex surface of the array substrate in the frame area, which will cause the cell thickness of the display device in the frame area to be greater than the cell thickness in the display area. Eventually, poor display problems, such as yellow display, appear near the frame area of the display device.

In view of this, a display panel and a display device are provided according to the present disclosure, which effectively solves the problems existing in the conventional technology, solves the poor display problems, such as yellow display, on the display panel close to a part of the frame area, and improves the display effect of the display panel.

Embodiments of the present disclosure will be described in detail with reference to FIGS. 1 to 21.

Figure 1:
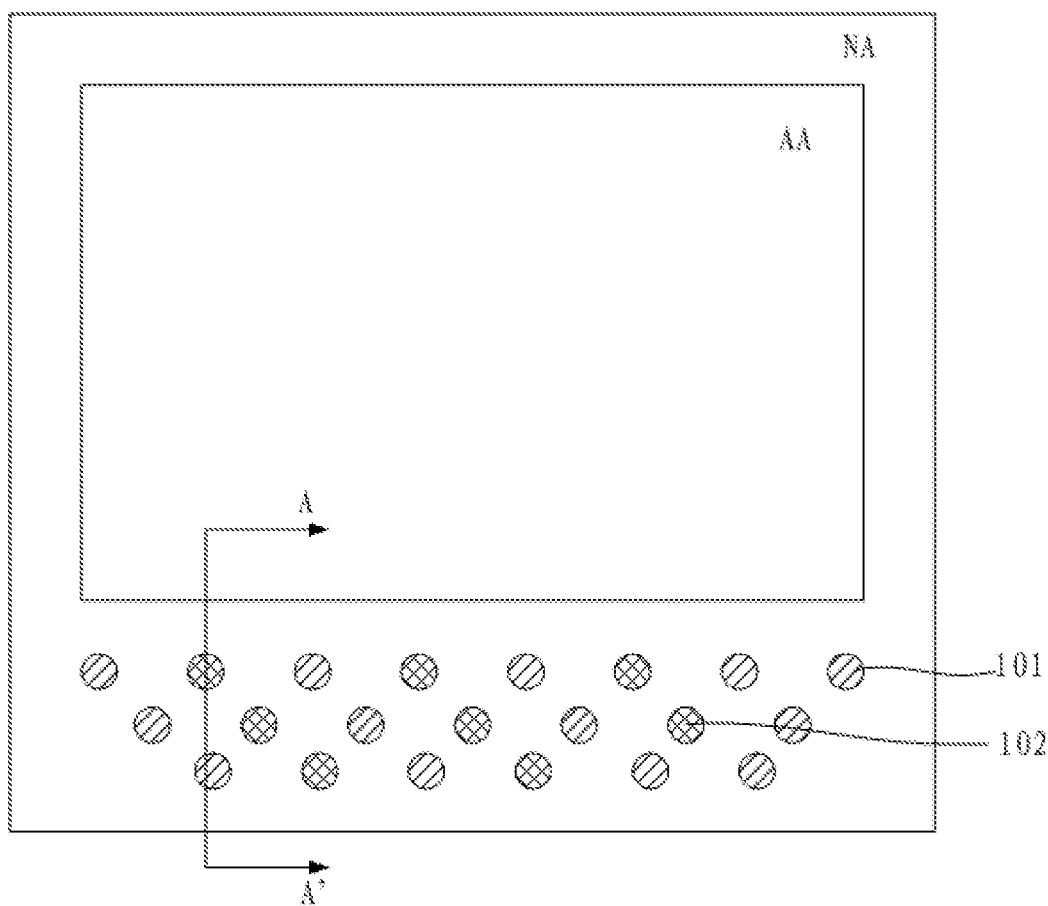
FIG. 1 is a schematic structural diagram of a display panel according to an embodiment of the present disclosure.
Figure 2:
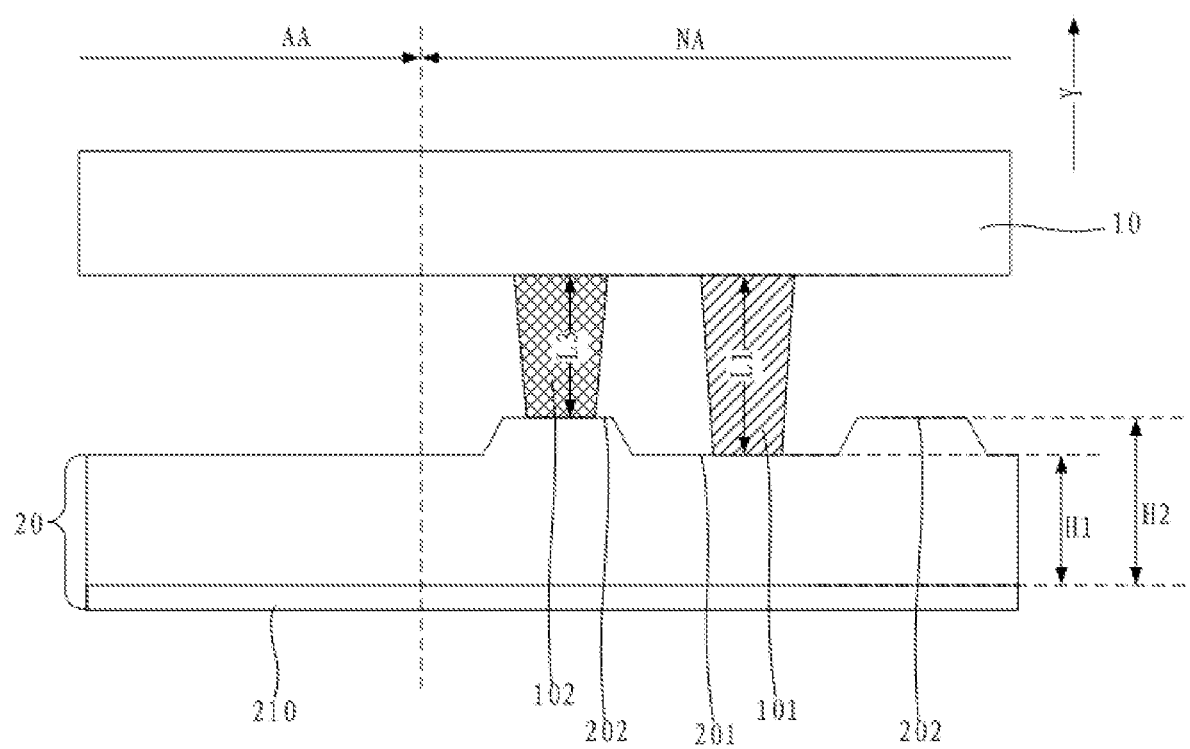
FIG. 2 is a cross-sectional view in a direction of AA' in FIG. 1.

Referring to FIG. 1 and FIG. 2, FIG. 1 is a schematic structural diagram of a display panel according to an embodiment of the present disclosure, and FIG. 2 is a cross-sectional view in a direction of AA' in FIG. 1. A display panel includes a first substrate 10 and a second substrate 20 arranged opposite to each other. The display panel is divided into a display area AA and a frame area NA located at a periphery of the display area AA.

In the frame area NA, multiple first main support columns 101 and multiple auxiliary support columns 102 are arranged. In a light emitting direction Y of the display panel, a length L1 of the first main support column 101 is greater than a length L3 of the auxiliary support column 102. The first main support column 101 and the auxiliary support column 102 are located on a side of the first substrate 10 facing the second substrate 20. The second substrate 20 includes a base 210, and the second substrate 20 further includes a first surface 201 and a second surface 202 facing the first substrate 10. A height H2 from the second surface 202 to the base 210 is greater than a height H1 from the first surface 201 to the base 210. An orthographic projection of the first main support column 101 on the base 210 is located within an orthographic projection of the first surface 201 on the base 210.

In an embodiment of the present disclosure, the support column provided in the present disclosure may be fixedly arranged in the first substrate 10. The support column may include the first main support column 101, the auxiliary support column 102. At least one of various types of support columns will be described below. Further, the shape of the orthographic projection of the support column according to the embodiment of the present disclosure on the base 210 may be a circle, a rectangle, etc., which is not limited in the present disclosure.

Embodiments of the present disclosure illustrate the orthographic projection of the first main support column 101 on the base 210 is located within the orthographic projection of the first surface 201 on the base 210, so that the first main support column 101 is opposite to a concave area of the surface of the second substrate 20 facing the first substrate 10. That is, the first main support column 101 with a longer length is provided to avoid the convex second surface 202. In this way, a situation that a larger cell thickness between the first substrate and the second substrate is formed by the first main support column 101 with a longer length, is improved. Therefore, the relatively high thickness uniformity of the display panel is ensured, the poor display problems, such as yellow display, on the display panel close to a part of the frame area is solved, and the display effect of the display panel is improved.

In the display panel according to an embodiment of the present disclosure, the support structure design including both the first main support column 101 and the auxiliary support column 102 is adopted. Compared with the display panel with only auxiliary support columns arranged in the frame area, in the display panel according to an embodiment of the present disclosure, the first main support column 101 is provided as the main support structure, and the auxiliary support column 102 is provided as the auxiliary support structure. Therefore, it is avoided that the display panel cannot rebound after being pressed, the support effect between the first substrate 10 and the second substrate 20 is improved, and the situation of insufficient support between the first substrate 10 and the second substrate 20 is avoided. In addition, in the display panel, the auxiliary support columns 102 does not need to be provided in a large density, to avoid the occurrence of pressing water ripples caused by excessive friction in the box in the frame area.

Referring to FIG. 1, a top surface of the first main support column 101 facing the second substrate 20 is in contact with the first surface 201, in an embodiment of the present disclosure. In addition, in an embodiment of the present disclosure, the orthographic projection of the auxiliary support column 102 on the base 210 may be located within the orthographic projection of the first surface 201 on the base

210. In one embodiment, the orthographic projection of the auxiliary support column 102 on the base 210 may also be located within the orthographic projection of the second surface 202 on the base 210, which needs to be designed according to actual applications.

When the orthographic projection of the auxiliary support column 102 on the base 210 is located within the orthographic projection of the second surface 202 on the base 210, a top surface of the auxiliary support column 102 facing the second substrate 20 may be in contact with the second surface 202. In one embodiment, the top surface of the auxiliary support column 102 facing the second substrate 20 may also have a gap with the second surface 202.

Figure 3:
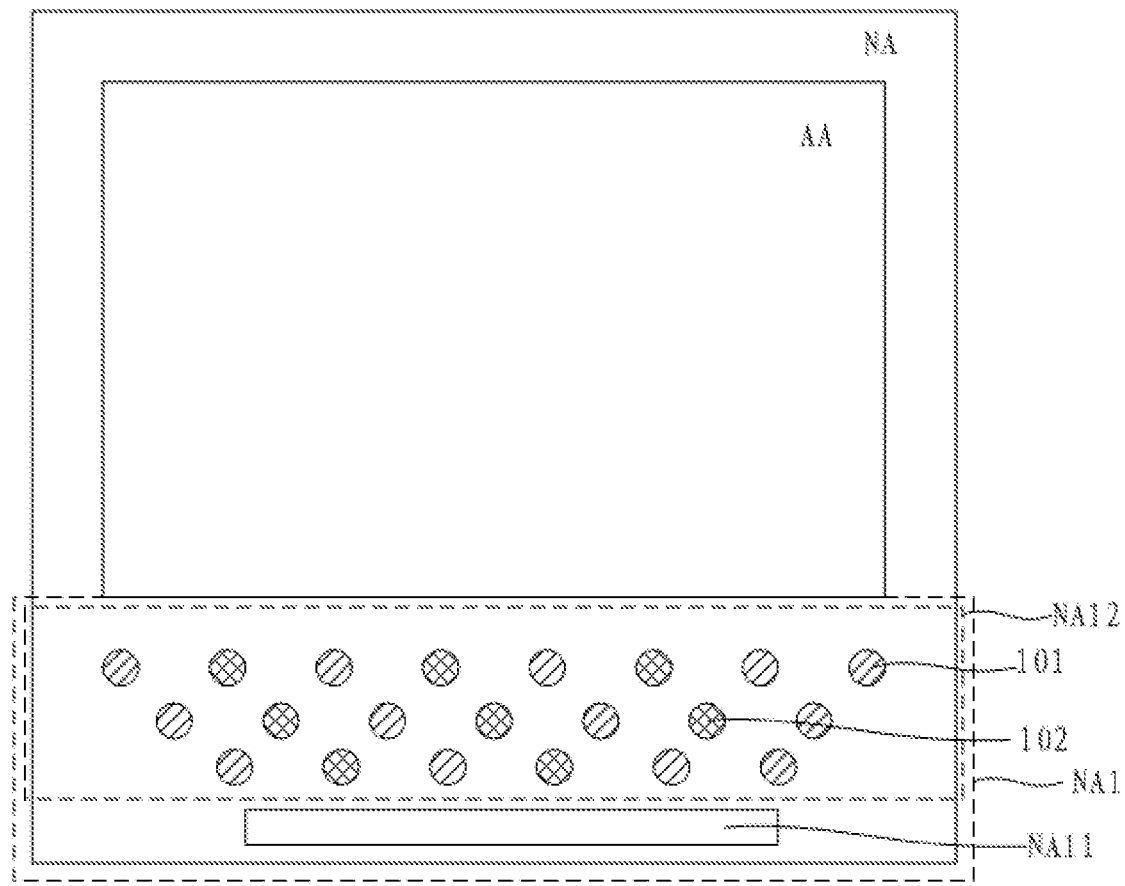
FIG. 3 is a schematic structural diagram of a display panel according to another embodiment of the present disclosure.

Referring to FIG. 3, FIG. 3 is a schematic structural diagram of a display panel according to another embodiment of the present disclosure. In an embodiment of the present disclosure, the frame area NA may be set around the display area AA. The frame area NA includes a step area NA1, and the first main support column 101 is located in the step area NA1. The step area NA1 includes a chip bonding area NA11, and a dense wiring area NA12 located between the display area AA and the chip bonding area NA11. The chip bonding area NA11 is used to bind a driving chip for providing driving signals for the display panel, and the dense wiring area NA12 is used to dispose driving lines connected to the driving chip.

With further reference to FIG. 3, the first main support column 101 according to the embodiments of the present disclosure is located at the dense wiring area NA12. Since the second substrate 20 includes a large number of wiring lines in the dense wiring area NA12, it is easier for the second substrate 20 to have uneven surfaces (that is, including the first surface and the second surface) toward the first substrate 10. By arranging the first main support column 101 in the dense wiring area NA12, the problem of the large cell thickness of the display panel in the dense wiring area NA12 can be solved, and the relatively high thickness uniformity of the display panel is ensured. Therefore, the poor display problems, such as yellow display, on the display panel close to a part of the frame area is improved, and the display effect of the display panel is improved.

Figure 4:
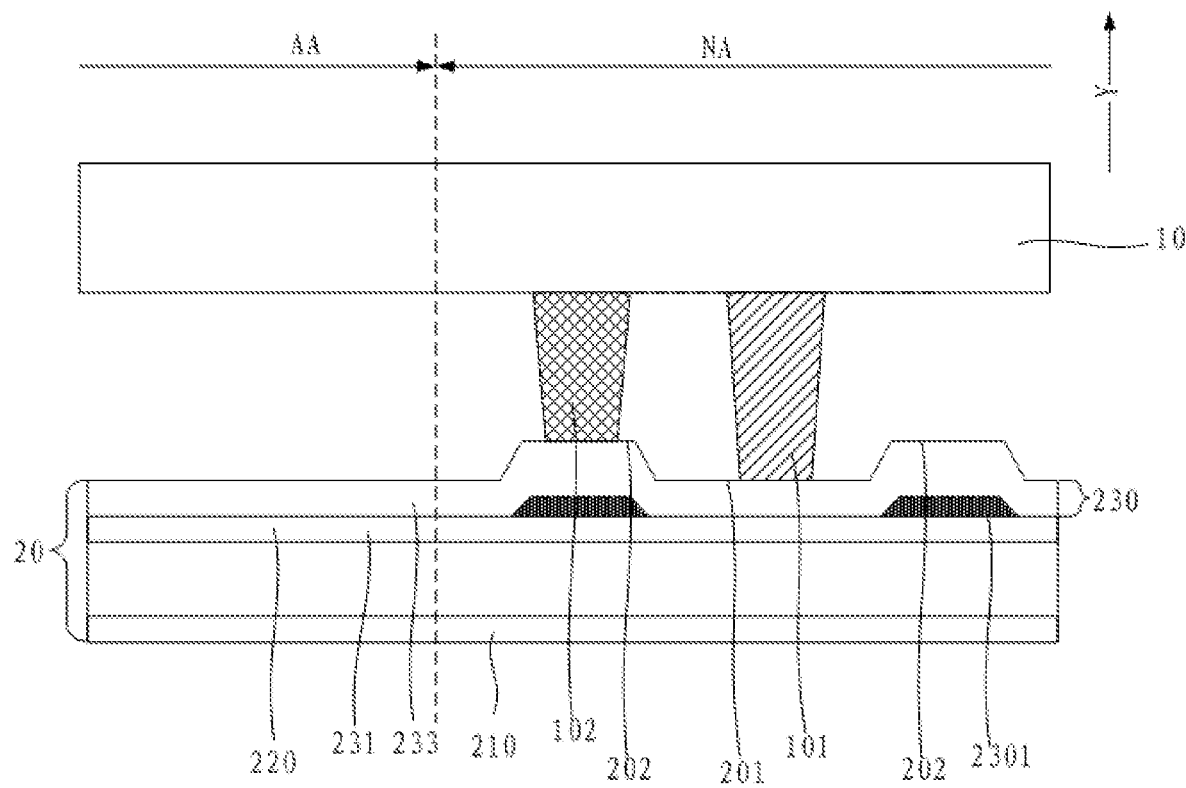
FIG. 4 is a schematic structural diagram of a display panel according to another embodiment of the present disclosure.

Referring to FIG. 4, FIG. 4 is a schematic structural diagram of a display panel according to another embodiment of the present disclosure. The second substrate 20 includes a planarization layer 220 on a side of the base 210 facing the first substrate 10, and a wiring layer 230 on a side of the planarization layer 220 facing the first substrate 10. In the frame area NA, the wiring layer 230 includes multiple electrode leads 2301. An orthographic projection of the electrode lead 2301 on the base 210 is located within the orthographic projection of the second surface 202 on the base 210, and the orthographic projection of the first surface 201 on the base 210 is located within the orthographic projection of a gap between two adjacent electrode leads 2301 on the base 210. In addition, the electrode lead 2301 provided in the present disclosure may be a touch signal line, a fingerprint recognition signal line, etc., which will not be limited in the present disclosure.

The multiple electrode leads 2301 provided in an embodiment of the present disclosure may be arranged in the dense wiring area of the frame area NA. The electrode leads 2301 may be connected to the lines of the display area AA and the driving chip, so that the driving chip provides driving signals for related lines in the display area AA through the electrode leads 2301. Since the electrode leads 2301 are located on the planarization layer 220, the surface, facing away from the base 210 (that is, the surface of the second substrate 20 facing the first substrate 10), of the insulating structure layer formed on the electrode lead 2301 may appear as an uneven surface including the first surface 201 and the second surface 202. The surface of the insulating structure layer corresponding to the electrode lead 2301 is the second surface 202, and the surface of the insulating structure layer corresponding to an area between the adjacent electrode leads 2301 includes the first surface 201.

It should be noted that the planarization layer 220 provided in an embodiment of the present disclosure functions to protect and level the surface of the structural layer. The planarization layer 220 has a relatively large thickness, which can protect the structural film layer under the planarization layer 220. In addition, the surface of the planarization layer 220 facing the first substrate 10 is flat, which can planarize the uneven surface of the film layer under the planarization layer 220, to facilitate the preparation of the film structure, such as pixel electrodes, common electrodes, touch signal lines, etc., above the planarization layer 220.

Figure 5:
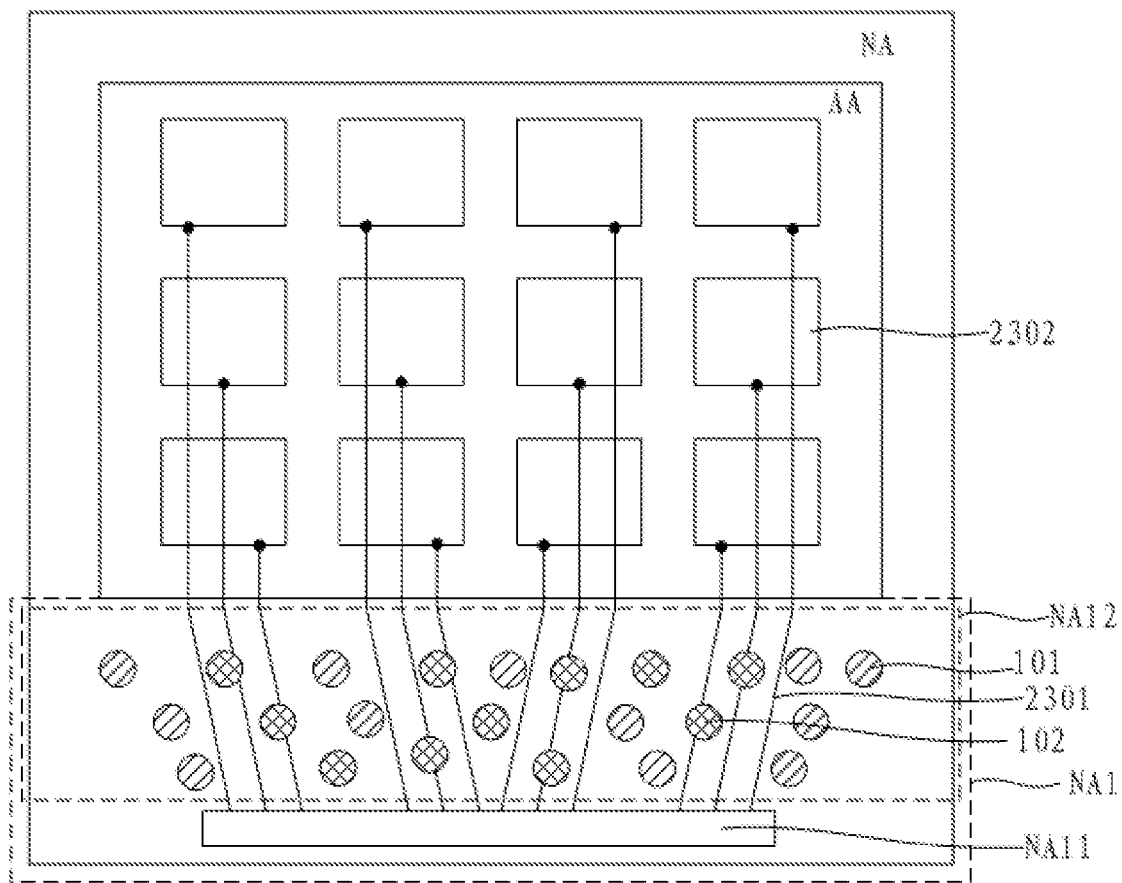
FIG. 5 is a schematic structural diagram of a display panel according to another embodiment of the present disclosure.
Figure 6:
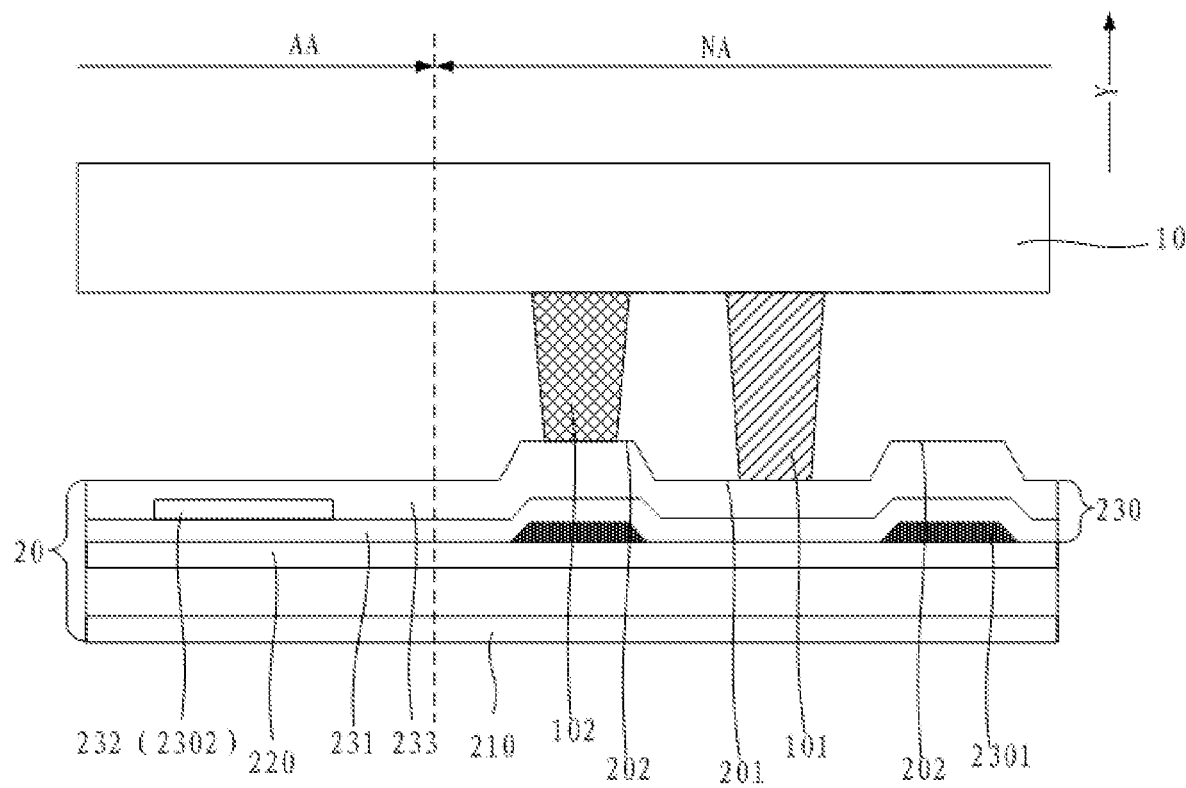
FIG. 6 is a schematic structural diagram of a display panel according to another embodiment of the present disclosure.

In combination with FIG. 5 and FIG. 6, the wiring layer 230 further includes at least one transparent conductive layer 232 which is located on a side of the electrode lead 2301 facing the first substrate 10 and is separated from the electrode lead 2301. A first insulating layer 231 is provided between the transparent conductive layer 232 and the electrode lead 2301. When the wiring layer 230 includes multiple transparent conductive layers 232, the insulating isolation layer structure is provided between adjacent transparent conductive layers 232. In addition, a second insulating layer 233 is further provided on a side of the transparent conductive layer 232 farthest away from the base 210 to cover and protect the structural layer. In the display area AA, at least one transparent conductive layer 232 includes multiple touch electrodes 2302. In the frame area NA, the electrode leads 2301 includes touch electrode leads for connecting the touch electrodes 2302. It should be noted that the touch electrode 2302 provided in the embodiment of the present disclosure is thinner than the electrode lead 2301, so the touch electrode 2302 has slight effect on the unevenness of the surface of the wiring layer 230 away from the base 210.

Figure 7:
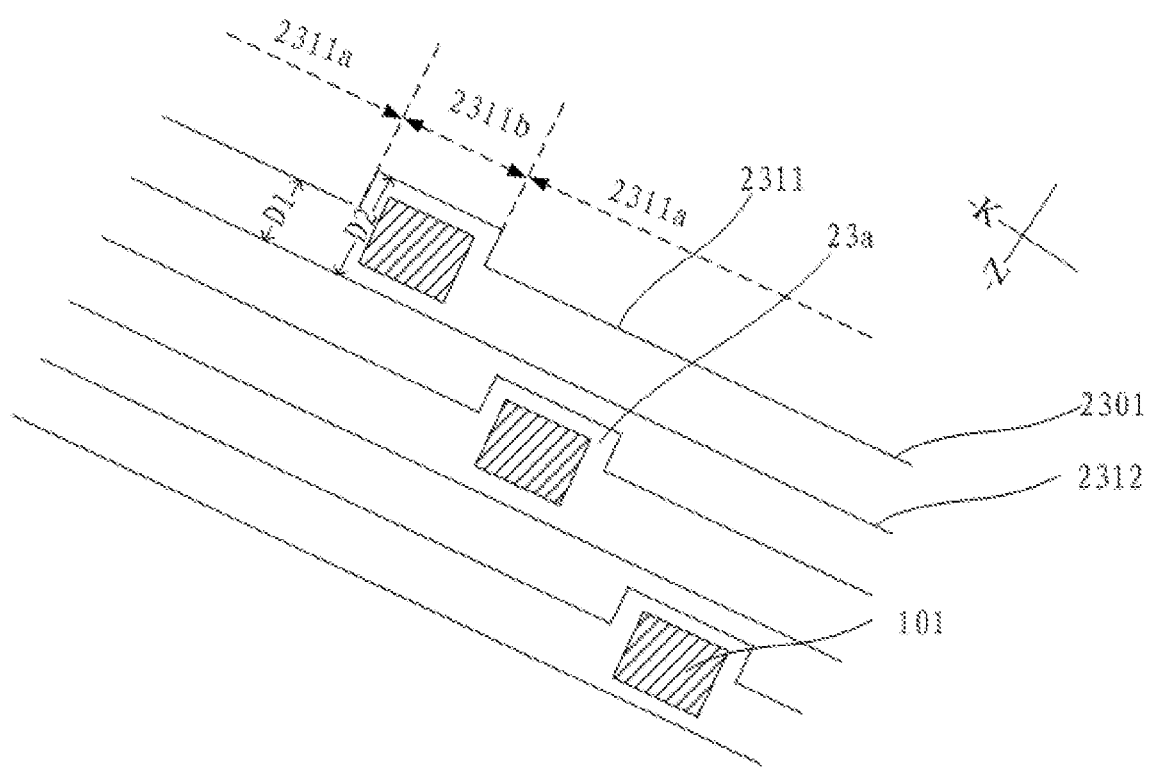
FIG. 7 is a schematic structural diagram of multiple electrode leads according to an embodiment of the present disclosure.

Generally, considering the convenience and reliability of the manufacturing process, and in order to avoid the influence of a parasitic capacitance between adjacent electrode leads, the electrode leads extend in a straight line, that is, the electrode leads extend in a straight line in correspondence with the first surface. In an embodiment of the present disclosure, in order to realize a uniform distribution of the support columns in the frame area, a winding portion may be formed on the electrode lead. Thus, the winding portion is also provided in an extension direction of the first surface, to correspond to the first main support column. It should be noted that since the shape of the electrode lead is the same as the shape of the corresponding first surface, the following figures all take the shape of the electrode lead as an example for description. Referring to FIG. 7, FIG. 7 is a schematic structural diagram of multiple electrode leads according to an embodiment of the present disclosure. The multiple electrode leads 2301 include a first electrode lead 2311 and a second electrode lead 2312 adjacent to the first electrode lead 2311. The first electrode lead 2311 includes a first straight portion 2311*a* and at least one first winding portion 2311*b*. The maximum distance between the first straight portion 2311*a* and the second electrode lead 2312 is D1, and the minimum distance between the first winding portion 2311*b* and the second electrode lead 2312 is D2, where D2 is greater than D1. A first placement area 23*a* is formed between the first winding portion 2311b and the second electrode lead 2312. The orthographic projection of the first main support column 101 on the base 210 is located within an orthographic projection of the first placement area 23a on the base 210. By arranging the first electrode lead 2311 with the first winding portion 2311b, sufficient space is provided between adjacent electrode leads, so that the first main support column 101 is correspondingly arranged between adjacent electrode leads 2301 with a small gap.

With further reference to FIG. 7, the second electrode lead 2312 provided in the embodiment of the present disclosure extends in a straight line in the length extension direction thereof. Since the first electrode lead 2311 provided in an embodiment of the present disclosure includes the first winding portion 2311b, the length of the first electrode lead 2311 is relatively increased. In this regard, the width of the first electrode lead 2311 is set to be greater than the width of the second electrode lead 2312, to reduce an overall impedance of the first electrode lead 2311. In this way, the difference between the impedances of the first electrode lead 2311 and the second electrode lead 2312 is small, and the consistency of the signal transmitted by the electrode lead 2301 is improved.

As shown in FIG. 7, multiple first placement areas 23a are formed between the electrode leads 2301 provided in the embodiment of the present disclosure. At least part of the multiple first placement areas 23a does not overlap in an arrangement direction Z of the multiple electrode leads 2301. It can be understood that the length extension direction of the electrode lead 2301 according to an embodiment of the present disclosure is a first direction K, and the arrangement direction of the multiple electrode leads 2301 is a second direction Z. The length extension directions of the multiple electrode leads 2301 are parallel to each other. The first direction K and the second direction Z intersect. By setting part of the multiple first placement areas 23a not to overlap in the second direction Z, the overall layout of the multiple first placement areas 23a can be optimized, and the limited space can be effectively used.

Figure 8:
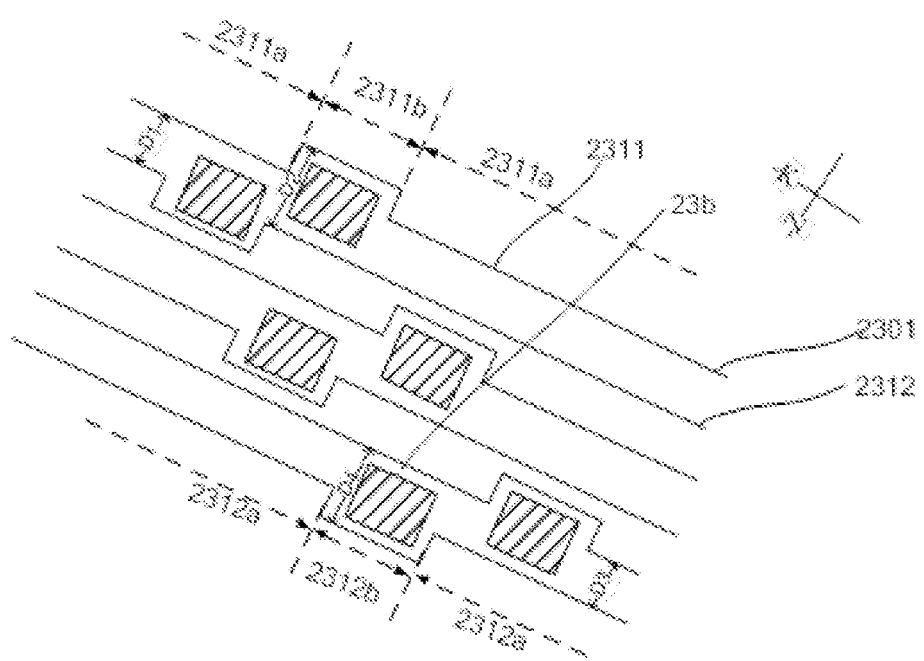
FIG. 8 is a schematic structural diagram of multiple electrode leads according to another embodiment of the present disclosure.

As shown in FIG. 8, FIG. 8 is a schematic structural diagram of multiple electrode leads according to another embodiment of the present disclosure. The second electrode lead 2312 includes a second straight portion 2312a and at least one second winding portion 2312b. The maximum distance between the second straight portion 2312a and an extension line of the first straight portion 2311a is D3, and the minimum distance between the second winding portion 2312a and the extension line of the first straight portion 2311a D4, where D4 is greater than D3. A second placement area 23b is formed between the second winding portion 2312b and the first electrode lead 2311. The orthographic projection of the first main support column 101 on the base 210 is located within an orthographic projection of the second placement area 23b on the base 210. By providing the second winding portion 2312b on the second electrode lead 2312, the second placement area 23b corresponding to the first main support column 101 is formed, to further expand the area corresponding to the first main support column 101 and improves the support effect. In another example, when the second winding portion 2312b is provided on the second electrode lead 2312, in the case that the difference between the number of second winding portions 2312b on the second electrode lead 2312 and the number of first winding portions 2311b on the first electrode lead 2311 is small, the widths of the second electrode lead 2312 and the first electrode lead 2311 may be the same.

In an embodiment of the present disclosure, when the number of the first winding portion 2311b on the first electrode lead 2311 is greater than the number of the second winding portion 2312b on the second electrode lead 2312, in order to reduce the impedance difference between the first electrode lead 2311 and the second electrode lead 2312, the width of the first electrode lead 2311 is greater than the width of the second electrode lead 2312.

In another embodiment, in an embodiment of the present disclosure, when the number of the first winding portion 2311b on the first electrode lead 2311 is less than the number of the second winding portion 2312b on the second electrode lead 2312, in order to reduce the impedance difference between the first electrode lead 2311 and the second electrode lead 2312, the width of the first electrode lead 2311 is less than the width of the second electrode lead 2312.

Figure 9:
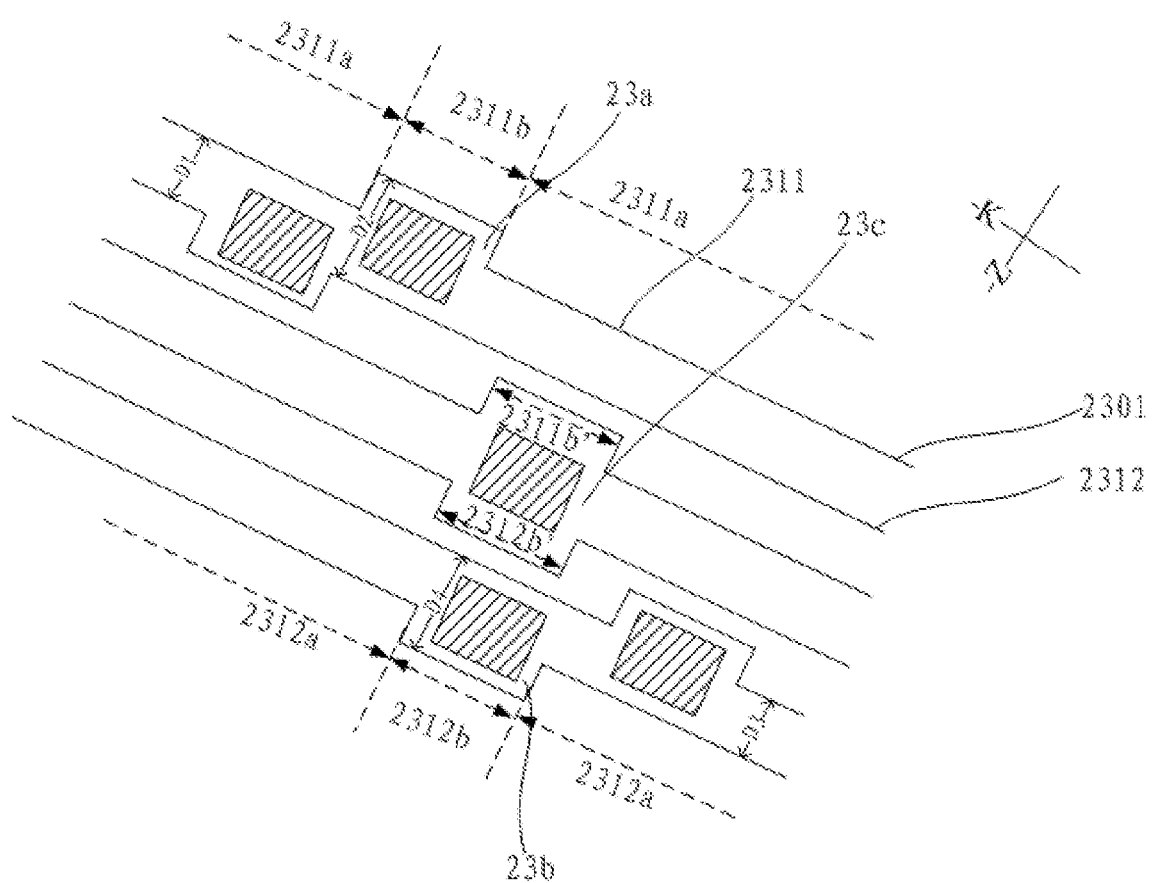
FIG. 9 is a schematic structural diagram of multiple electrode leads according to another embodiment of the present disclosure.

As shown in FIG. 9, FIG. 9 is a schematic structural diagram of multiple electrode leads according to another embodiment of the present disclosure. The first winding portion 2311b includes at least one multiplexing first winding portion 2311b', and the second winding portion 2312b includes at least one multiplexing second winding portion 2312b'. The multiplexing first winding portion 2311b' and the multiplexing second winding portion 2312b' are arranged oppositely in the arrangement direction Z of the multiple electrode leads 2301. A third placement area 23c is formed between the multiplexing first winding portion 2311b' and the multiplexing second winding portion 2312b'. The orthographic projection of the first main support columns 101 on the base 210 is located within an orthographic projection of the third placement area 23c on the base 210. By oppositely arranging the multiplexing first winding portion 2311b' and the multiplexing second winding portion 2312b', the area of the placement area is enlarged, and it is convenient to arrange the first main support column 101 corresponding to the third placement area 23c. In addition, the winding size of the multiplexing first winding portion and the winding size of the multiplexing second winding portion are reduced, to reduce the risk of electrode lead wire breakage and improve the reliability of the manufacturing process. Furthermore, the problem of excessive load difference caused by the length difference between the first electrode lead and the second electrode lead is reduced, and the display effect of the display panel is ensured.

Figure 10:
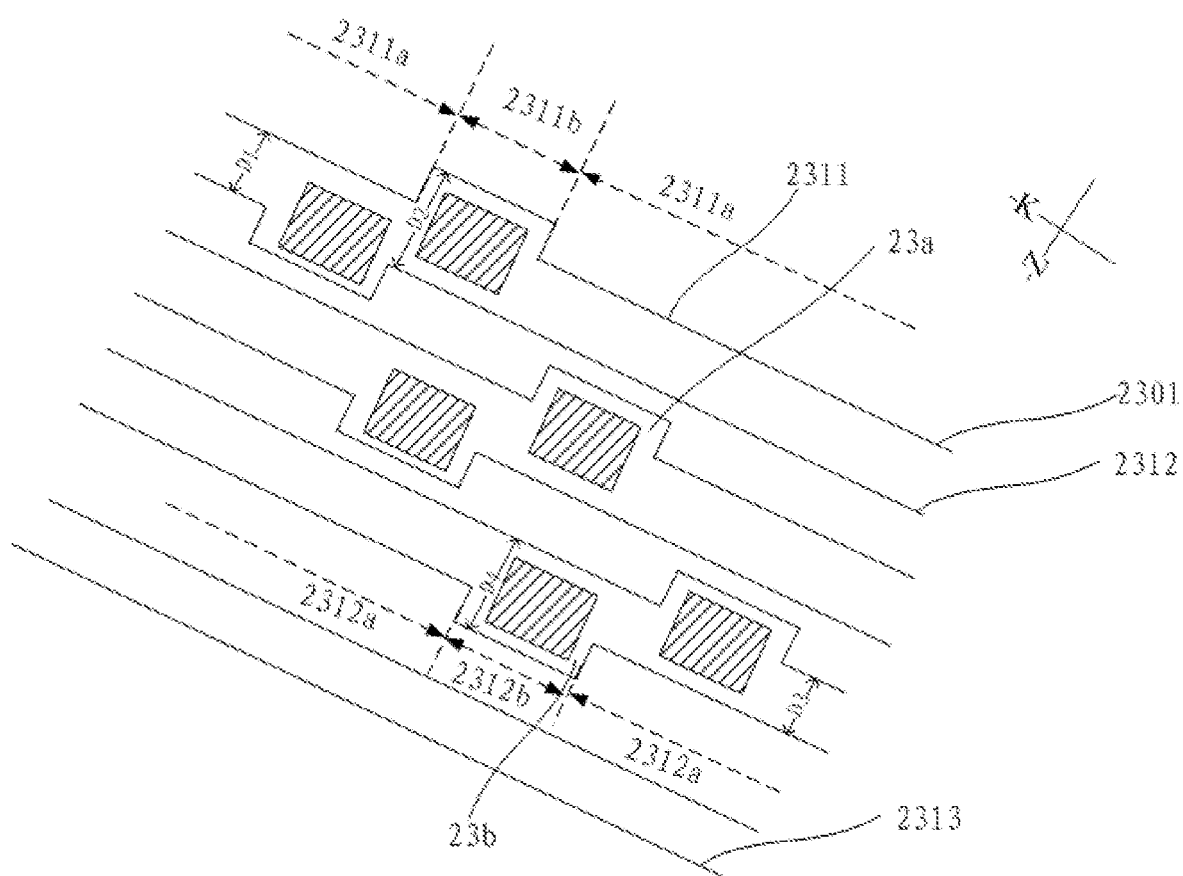
FIG. 10 is a schematic structural diagram of multiple electrode leads according to another embodiment of the present disclosure.

As shown in FIG. 10, FIG. 10 is a schematic structural diagram of multiple electrode leads according to another embodiment of the present disclosure. The multiple electrode leads 2301 further includes a third electrode lead 2313. The third electrode lead 2313 extends in a straight line in a length extension direction of the third electrode lead 2313. The width of the first electrode lead 2311 is greater than the width of the third electrode lead 2313, and the width of the second electrode lead 2312 is greater than the width of the third electrode lead 2313. Therefore, the impedance difference among the first electrode lead 2311, the second electrode lead 2312, and the third electrode lead 2313 is small, which improves the consistency of the signals transmitted by the multiple electrode leads 2301.

Figure 11:
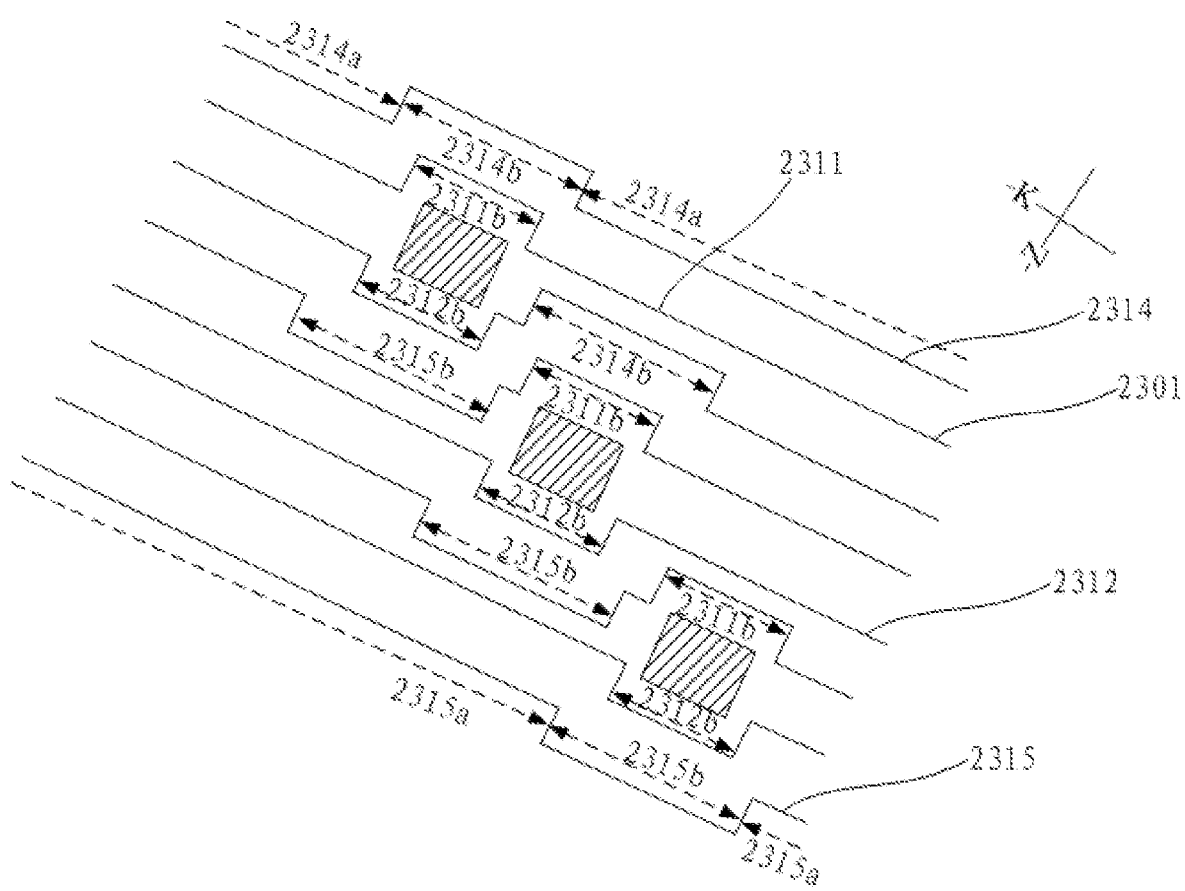
FIG. 11 is a schematic structural diagram of multiple electrode leads according to another embodiment of the present disclosure.

As shown in FIG. 11, FIG. 11 is a schematic structural diagram of multiple electrode leads according to another embodiment of the present disclosure. The multiple electrode leads 2301 includes at least one fourth electrode lead 2314 on a side of the first electrode lead 2311 facing away from the second electrode lead 2312. The fourth electrode lead 2314 includes a fourth straight portion 2314a and at least one fourth winding portion 2314b. The fourth winding portion 2314b is arranged around the first winding portion 2311b along the contour of the first winding portion 2311b. In addition, the multiple electrode leads 2301 includes at least one fifth electrode lead 2315 on a side of the second electrode lead 2312 facing away from the first electrode lead 2311. The fifth electrode lead 2315 includes a fifth straight portion 2315a and at least one fifth winding portion 2315b. The fifth winding portion 2315b is arranged around the second winding portion 2312b along the contour of the second winding portion 2312b. Therefore, the distance between adjacent electrode leads at the winding portion is reduced, and the influence of a parasitic capacitance between adjacent electrode leads is reduced.

It should be noted that, the fourth electrode lead 2314b according to an embodiment of the present disclosure is located on the side of the first electrode lead 2311 facing away from the second electrode lead 2312. The fourth electrode lead 2314 may be reused as the first electrode lead 2311, the second electrode lead 2312 or the fifth electrode lead 2315, or may be an independent electrode lead 2301, which will not be limited in the present disclosure, and needs to be analyzed according to the location of the first electrode lead 2311. In other words, as long as the electrode lead located on the side of the first electrode lead 2311 facing away from the second electrode lead 2312 and having the fourth winding portion 2314b around the first winding portion 2311b is defined as the fourth electrode lead 2314. Similarly, the fifth electrode lead 2315 may be reused as the first electrode lead 2311, the second electrode lead 2312 or the fourth electrode lead 2314, or may be an independent electrode lead 2301. In other words, as long as the electrode lead located on the side of the second electrode lead 2312 facing away from the first electrode lead 2311 and having the fifth winding portion 2315b around the second winding portion 2312b is defined as the fifth electrode lead 2315.

Figure 12:
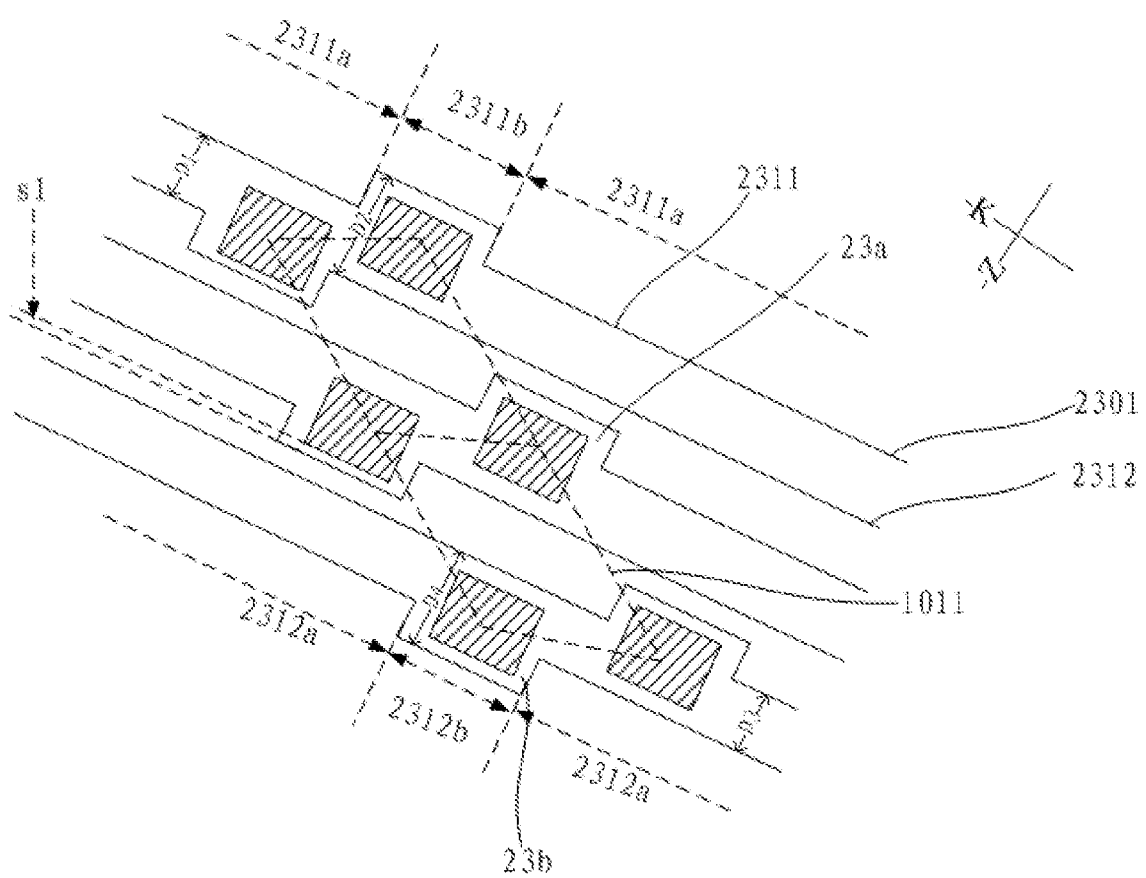
FIG. 12 is a schematic structural diagram of multiple electrode leads according to another embodiment of the present disclosure.

As shown in FIG. 12, FIG. 12 is a schematic structural diagram of multiple electrode leads according to another embodiment of the present disclosure. The minimum distance s1 between the contour line of the orthographic projection of the first main support column 101 on the base 210 and the contour line of the orthographic projection of the winding portion of the first main support column 101 on the base 210 is 2-5 µm, including endpoint values. By optimizing the minimum distance between the first main support column 101 and the winding portion, it is ensured that the orthographic projection of the first main support column 101 on the base 210 is located within the corresponding placement area of the winding portion.

As shown in FIG. 12, in an embodiment of the present disclosure, at least one connection pattern of the multiple first main support columns 101 is a grid pattern 1011. Each grid cell in the grid pattern 1011 in the embodiment of the present disclosure is a centrosymmetric pattern. For example, the grid pattern 1011 as shown in FIG. 12 is composed of multiple parallelogram grid cells. Specifically, the centrosymmetric pattern may be a polygon, a circle, etc., which will not be limited in the present disclosure.

Figure 13:
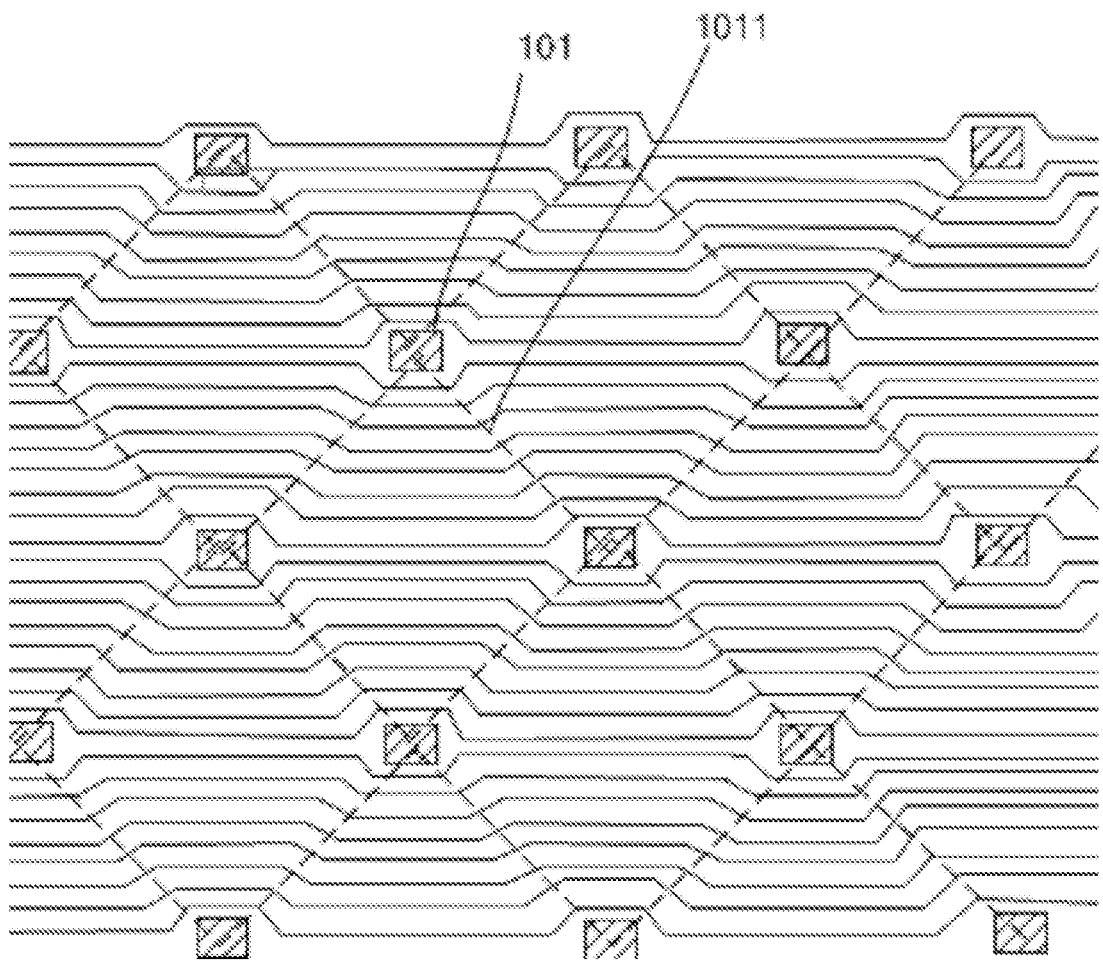
FIG. 13 is a schematic structural diagram of multiple electrode leads according to another embodiment of the present disclosure.

In another embodiment, the grid pattern 1011 as shown in FIG. 13 is composed of diamond-shaped grid cells. Due to the gradual expansion of the electrode leads, the diamond-shaped grid cell is formed by combining the outer expansion lines of the adjacent first main support columns 101, which will not be limited in the present disclosure, and needs to be designed according to actual applications.

Figure 14:
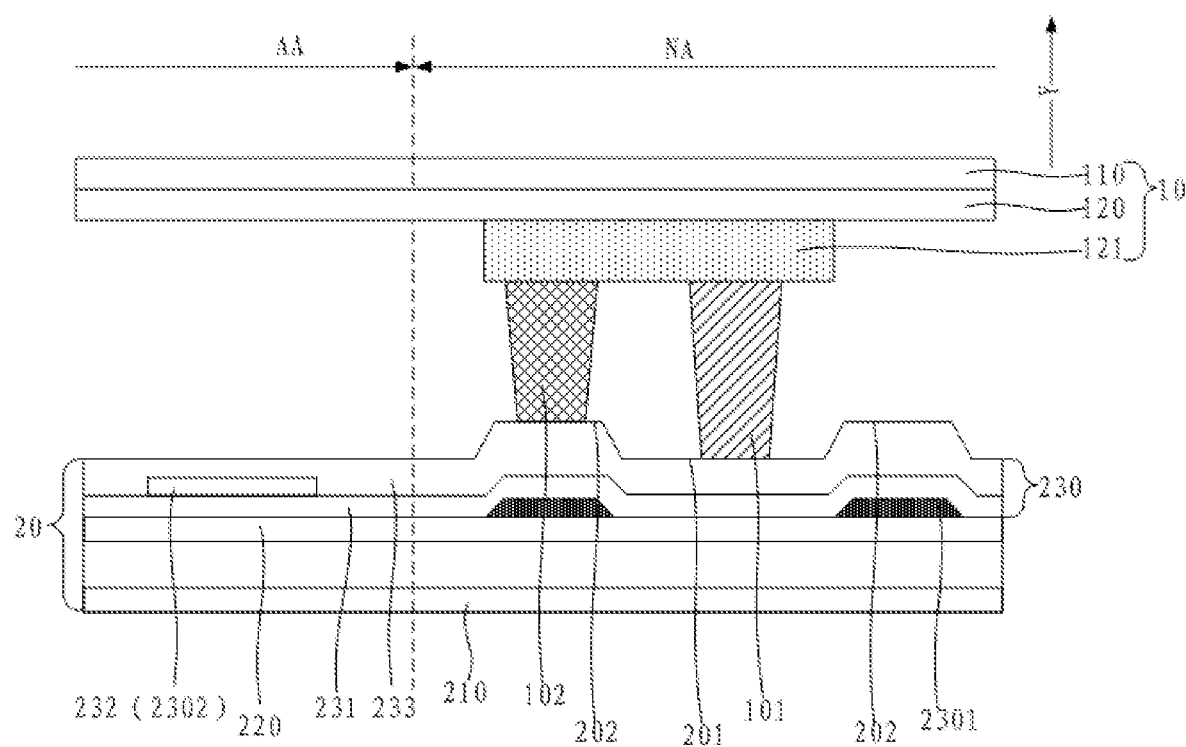
FIG. 14 is a schematic structural diagram of a display panel according to another embodiment of the present disclosure.

As shown in FIG. 14, FIG. 14 is a schematic structural diagram of a display panel according to another embodiment of the present disclosure. In an embodiment of the present disclosure, the first substrate 10 includes a black matrix 120. The first substrate 10 includes a cover plate 110, and the black matrix 120 may be located on a side of the cover plate 110 facing the second substrate 20. The black matrix 120 includes light-transmitting openings corresponding to pixel units in the display area AA. In the frame area NA, the first substrate 10 includes multiple first color resist layers 121 located on a side of the black matrix 120 facing the second substrate 20. The first main support column 101 is located on a side of the first color resist layer 121 facing the second substrate 20. In an embodiment of the present disclosure, a top surface of the first main support column 101 facing away from the first color resist layer 121 may be in contact with the first surface 201 and functions as a main support structure between the first substrate 10 and the second substrate 20.

Figure 15:
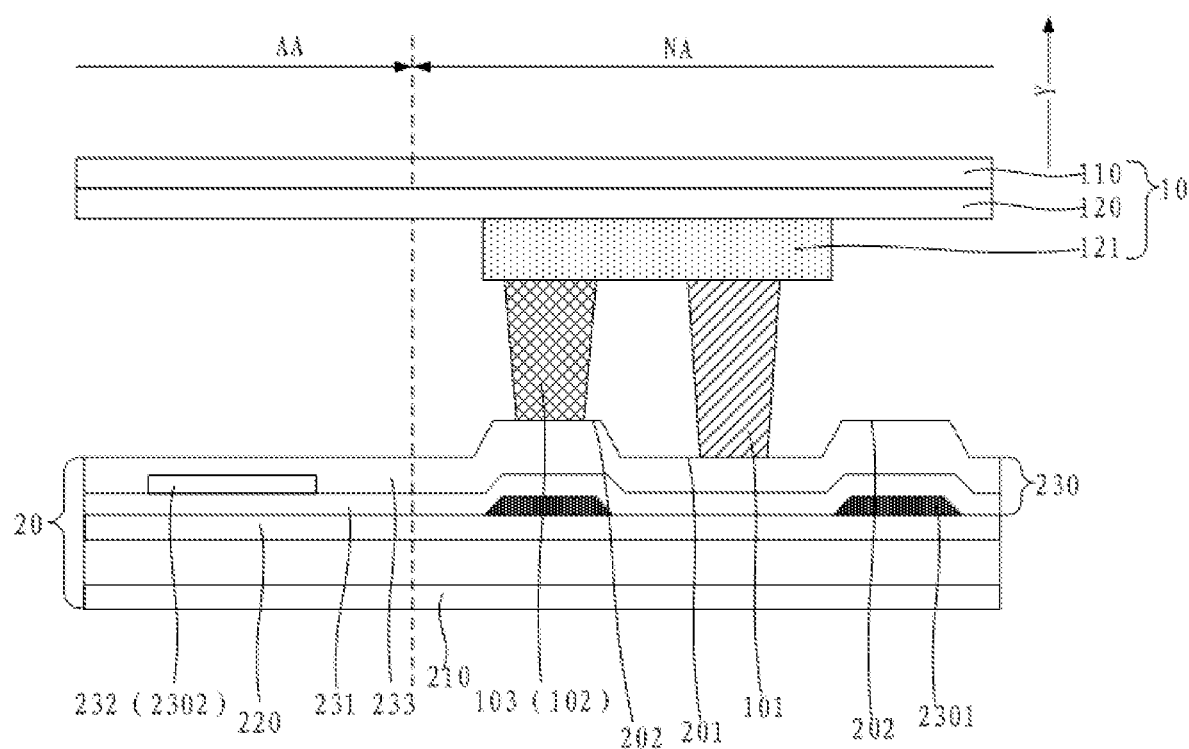
FIG. 15 is a schematic structural diagram of a display panel according to another embodiment of the present disclosure.

As shown in FIG. 15, FIG. 15 is a schematic structural diagram of a display panel according to another embodiment of the present disclosure. In the frame area NA, at least one first auxiliary support column 103 is provided on a side of at least one first color resist layer 121 facing the second substrate 20. In the light emitting direction Y of the display panel, the length of the first auxiliary support column 103 is less than the length of the first main support column 101. The auxiliary support column 102 includes the first auxiliary support column 103, and an orthographic projection of the first auxiliary support column 103 on the base 210 is located within the orthographic projection of the second surface 202 on the base 210. In an embodiment of the present disclosure, a top surface of the first auxiliary support column 103 facing the second substrate 20 is in contact with the second surface 202, so that the first auxiliary support column 103 has the same function as the first main support column 101 and functions as the main support structure between the first substrate 10 and the second substrate 20. In this way, the support effect between the first substrate 10 and the second substrate 20 is improved.

Figure 16:
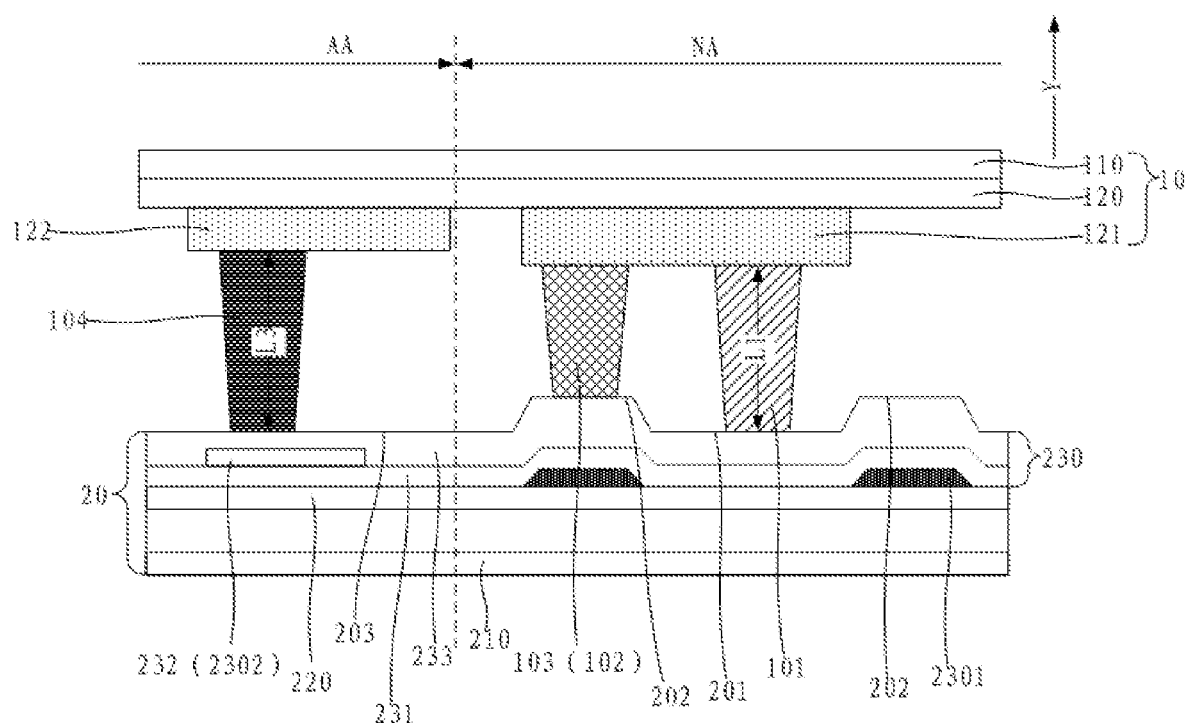
FIG. 16 is a schematic structural diagram of a display panel according to another embodiment of the present disclosure.

As shown in FIG. 16, FIG. 16 is a schematic structural diagram of a display panel according to another embodiment of the present disclosure. In the display area AA, the first substrate 10 includes multiple second color resist layers 122 located on the side of the black matrix 120 facing the second substrate 20, and display area main support columns 104 located on a side of the multiple second color resist layers 122 facing the second substrate 20. In the light emitting direction Y of the display panel, the length L2 of the display area main support column 104 is greater than or equal to the length L1 of the first main support column 101. A ratio of the density of the first auxiliary support column 103 to the density of the display area main support column 104 is 1:(3~5), including endpoint values. By optimizing the density ratio of the first auxiliary support column 103 to the display area main support column 104, the overall support effect of the display panel is improved, and the problem of pressing water ripples in the frame area of the display panel caused by the excessive density of the first auxiliary support column is avoided.

It is understandable that in the display area AA, the second substrate 20 includes a third surface 203 facing the first substrate 10. The orthographic projection of the display area main support column 104 on the base 210 is located within an orthographic projection of the third surface 203 on the base 210. In an embodiment of the present disclosure, a height from the third surface 203 to the base 210 is less than the height from the second surface 202 to the base 210, and the height from the third surface 203 to the base 210 tends to be the same as the height from the first surface 201 to the base 210. Therefore, a length of the display area main support column 104 may be equal to a length of the first main support column 101, and a top surface of the display area main support column 104 facing the second substrate 20 is in contact with the third surface 203 and functions as a main support structure in the display area AA. In one embodiment, since there are more lines in the frame area NA than in the display area AA, the thickness of the second substrate 20 in the frame area NA is generally greater than that in the display area AA. Thus, the height from the third surface 203 to the base 210 may be less than the height from the first surface 201 to the base 210. In order to ensure that the top surface of the display area main support column 104 facing the second substrate 20 is in contact with the third surface 203, the length of the display area main support column 104 need to be greater than the length of the first main support column 101. It should be noted that in an embodiment of the present disclosure, the surface of the base 210 facing the first substrate 10 is on the same horizontal plane.

Figure 17:
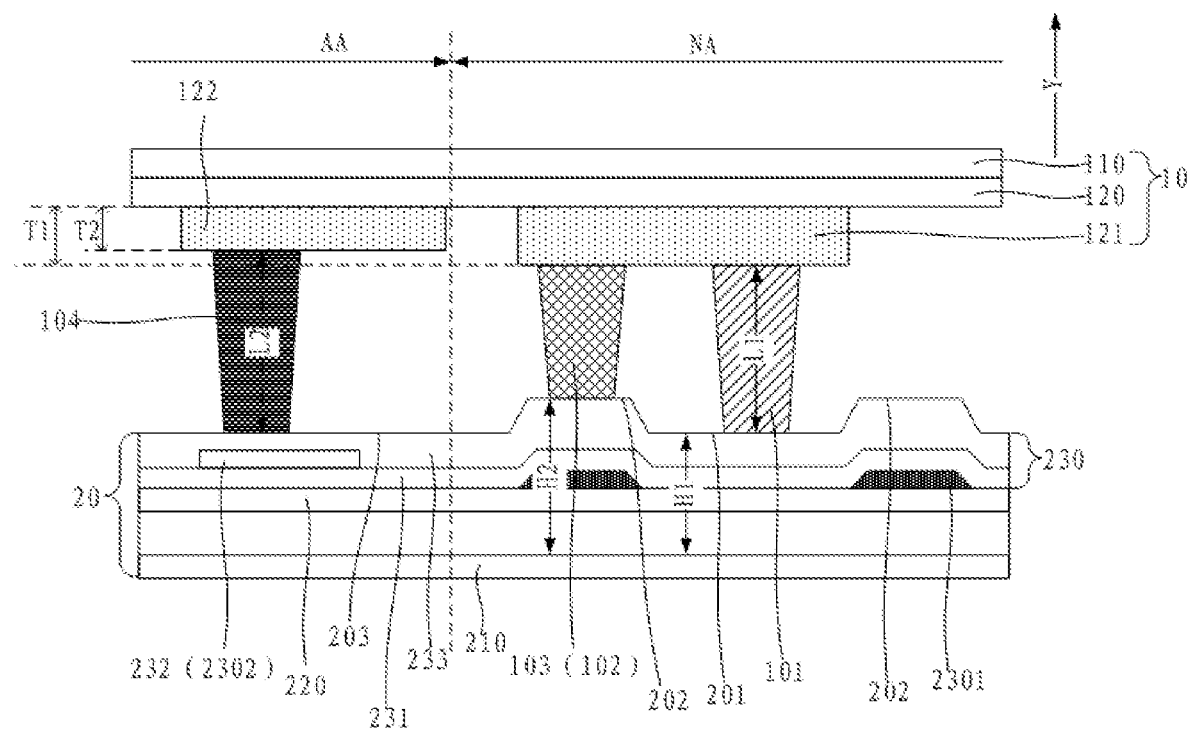
FIG. 17 is a schematic structural diagram of a display panel according to another embodiment of the present disclosure.

As shown in FIG. 17, FIG. 17 is a schematic structural diagram of a display panel according to another embodiment of the present disclosure. Since the black matrix 120 has transparent openings corresponding to the pixel units in the display area AA, in a manufacturing process, the second color resist 122 may flow to the transparent openings, and the thickness of the second color resist 122 is thinner than an expected thickness. That is, in an embodiment of the present disclosure, a thickness T2 of the second color resist layer 122 is smaller than a thickness T1 of the first color resist layer 121. The thickness of the first color resist layer 121 is T1, the thickness of the second color resist layer 122 is T2, the length of the first main support column 101 is L1, and the length of the display area main support column 104 is L2, where T1+L1≥T2+L2.

In an embodiment of the present disclosure, the height from the first surface 201 to the base 210 is H1, the height from the second surface 202 to the base 210 is H2, the length of the display area main support column 104 is L2, and the length of the first auxiliary support column 103 is L3. The relationship between H1, H2, T1, T2, L2, and L3 may be as follows: (T1−T2)+(H2−H1)≥(L2−L3) or (T1−T2)+(H2−H1)<(L2−L3).

Figure 18:
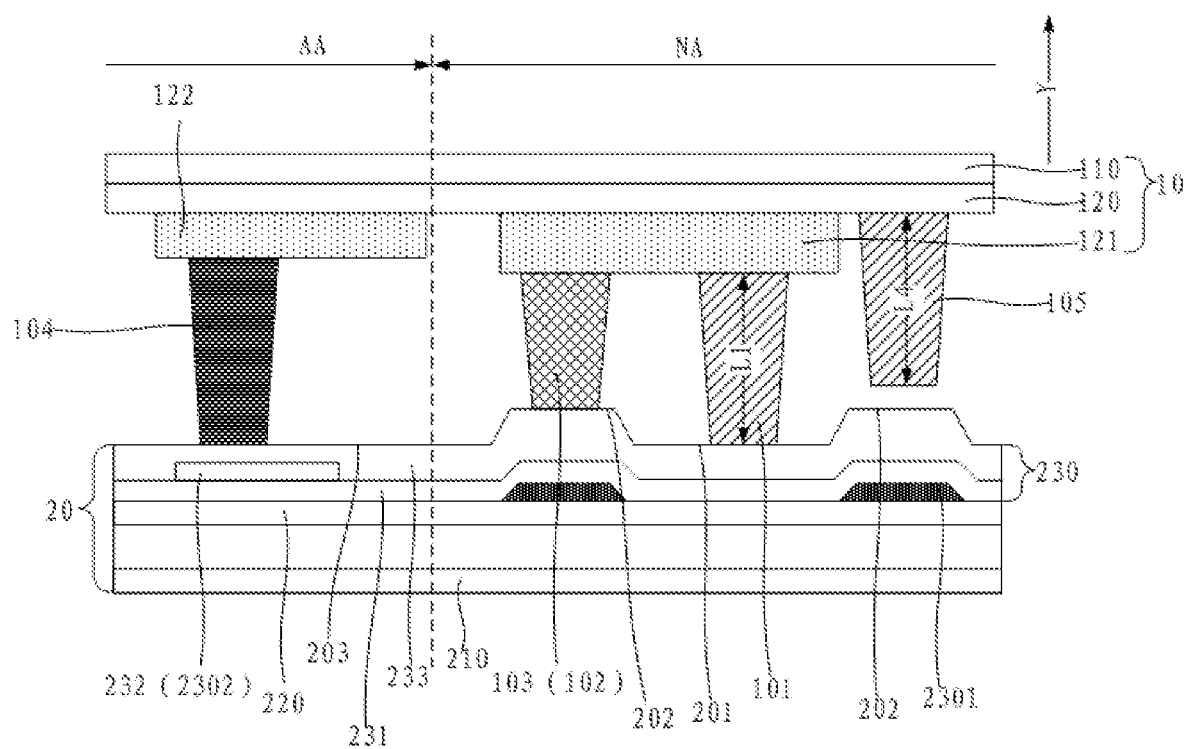
FIG. 18 is a schematic structural diagram of a display panel according to another embodiment of the present disclosure.

As shown in FIG. 18, FIG. 18 is a schematic structural diagram of a display panel according to another embodiment of the present disclosure. In the case that (T1−T2)+(H2−H1)≥(L2−L3), namely, the top surface of the first auxiliary support column 103 facing the second substrate 20 is in contact with the second surface 202, at least one second main support column 105 is provided on the side of the black matrix 120 facing the second substrate 20 in the frame area NA. A surface of the second main support column 105 facing away from the second substrate 20 is in contact with the surface of the black matrix 120 facing the second substrate 20. In the light emitting direction Y of the display panel, the length L4 of the second main support column 105 is the same as the length L1 of the first main support column 101. An orthographic projection of the second main support column 105 on the base 210 is located within the orthographic projection of the second surface 202 on the base 210. In an embodiment of the present disclosure, a gap is between a top surface of the second main support column 105 facing the second substrate 20 and the second surface 202. Thus, the second main support column 105 functions as an auxiliary support structure between the first substrate 10 and the second substrate 20. Therefore, the problem caused by insufficient support between the first substrate 10 and the second substrate 20 is avoided.

Figure 19:
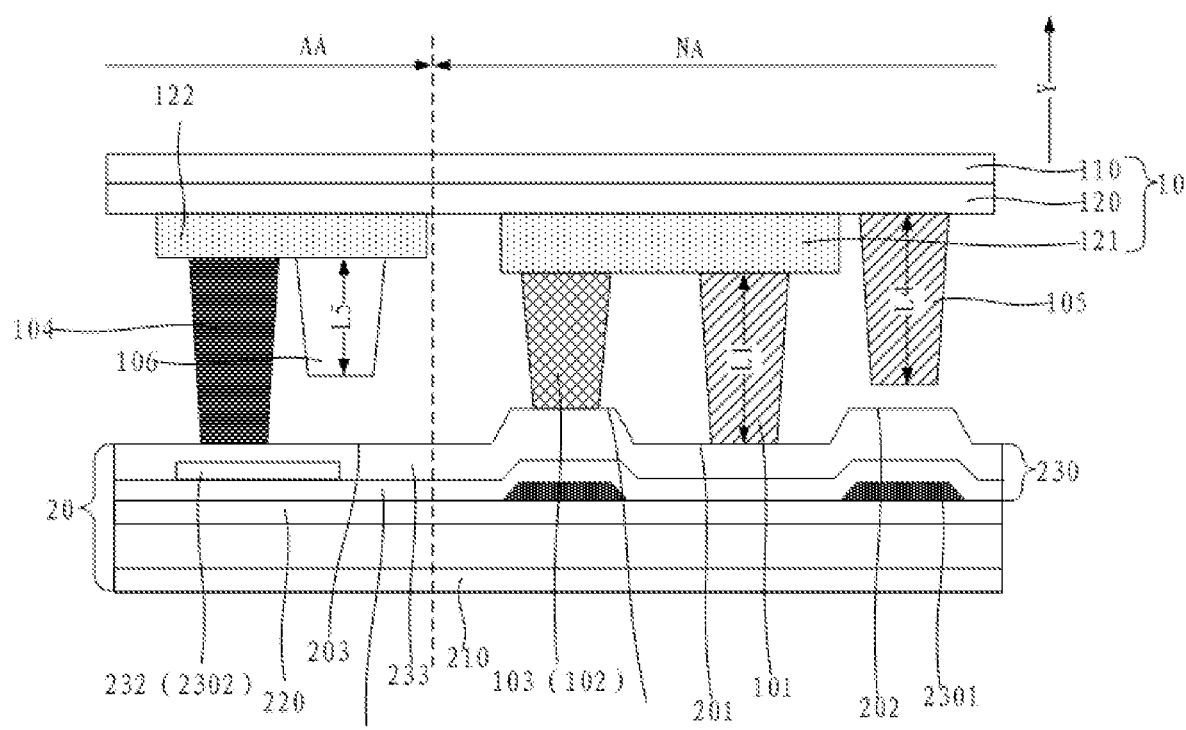
FIG. 19 is a schematic structural diagram of a display panel according to another embodiment of the present disclosure.

As shown in FIG. 19, FIG. 19 is a schematic structural diagram of a display panel according to another embodiment of the present disclosure. In the display area AA, a display area auxiliary support column 106 is provided on the side of the second color resist layer 122 facing the second substrate 20. In the light emitting direction Y of the display panel, the length L5 of the display area auxiliary support column 106 is less than the length L1 of the first main support column 101. A gap is between a top surface of the display area auxiliary support column 106 facing the second substrate 20 and the third surface 203. Thus, the display area auxiliary support column 106 functions as an auxiliary support structure in the display area AA. In an embodiment of the present disclosure, a ratio of the density of the second main support column 105 to the density of the display area auxiliary support column 106 is 1:(3~5), including endpoint values. By optimizing the number of the second main support columns 105 (that is, the density ratio relationship), the support effect between the first substrate 10 and the second substrate 20 is improved.

Figure 20:
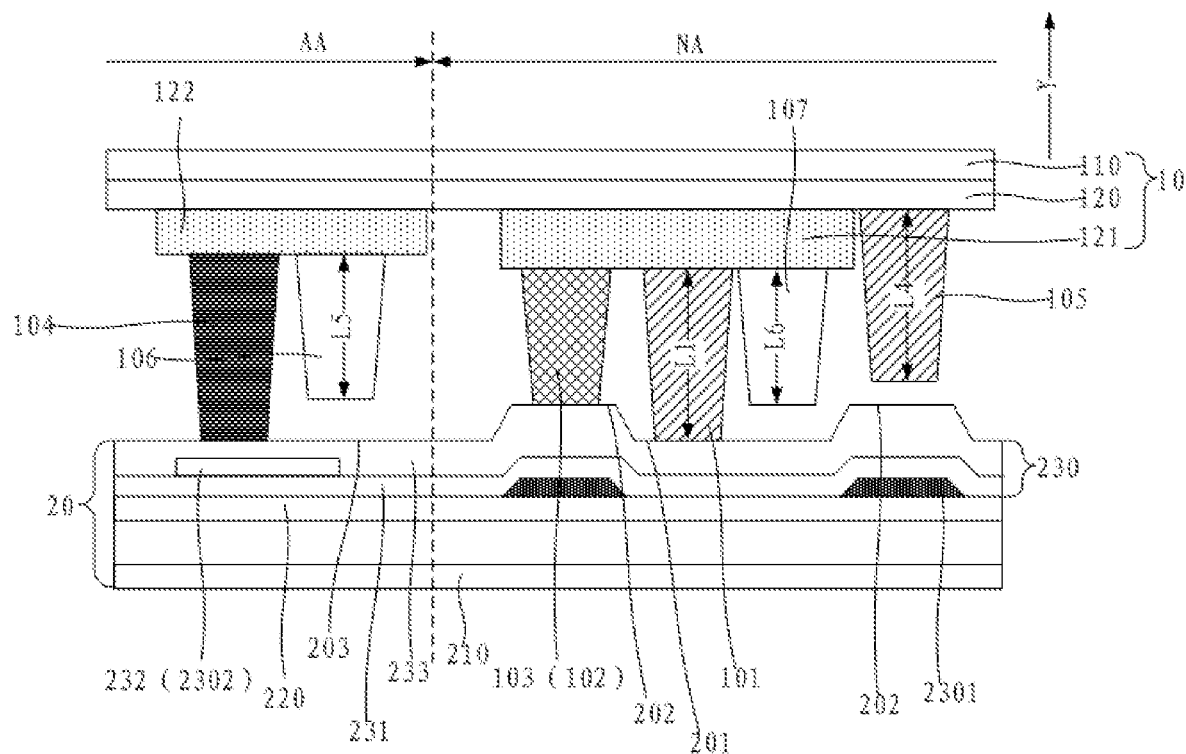
FIG. 20 is a schematic structural diagram of a display panel according to another embodiment of the present disclosure.

In an embodiment of the present disclosure, the display panel may further include other types of auxiliary support structures in the frame area. As shown in FIG. 20, FIG. 20 is a schematic structural diagram of a display panel according to another embodiment of the present disclosure. In the frame area NA, at least one second auxiliary support column 107 is provided on the side of at least one first color resist layer 121 facing the second substrate 20. In the light emitting direction Y of the display panel, a length L6 of the second auxiliary support column 107 is less than the length L1 of the first main support column 101. An orthographic projection of the second auxiliary support column 107 on the base 210 is located within the orthographic projection of the first surface 201 on the base 210. A gap is between a top surface of the second auxiliary support column 107 facing the second substrate 20 and the first surface 201. Thus, the second auxiliary support column 107 functions as an auxiliary support structure between the first substrate 10 and the second substrate 20. Therefore, the support effect between the first substrate 10 and the second substrate 20 is improved.

In an embodiment of the present disclosure, the first substrate 10 may be a color filter substrate, and the second substrate may be an array substrate.

Correspondingly, a display device is provided according to an embodiment of the present disclosure. The display device includes the display panel according to any one of the foregoing embodiments.

Figure 21:
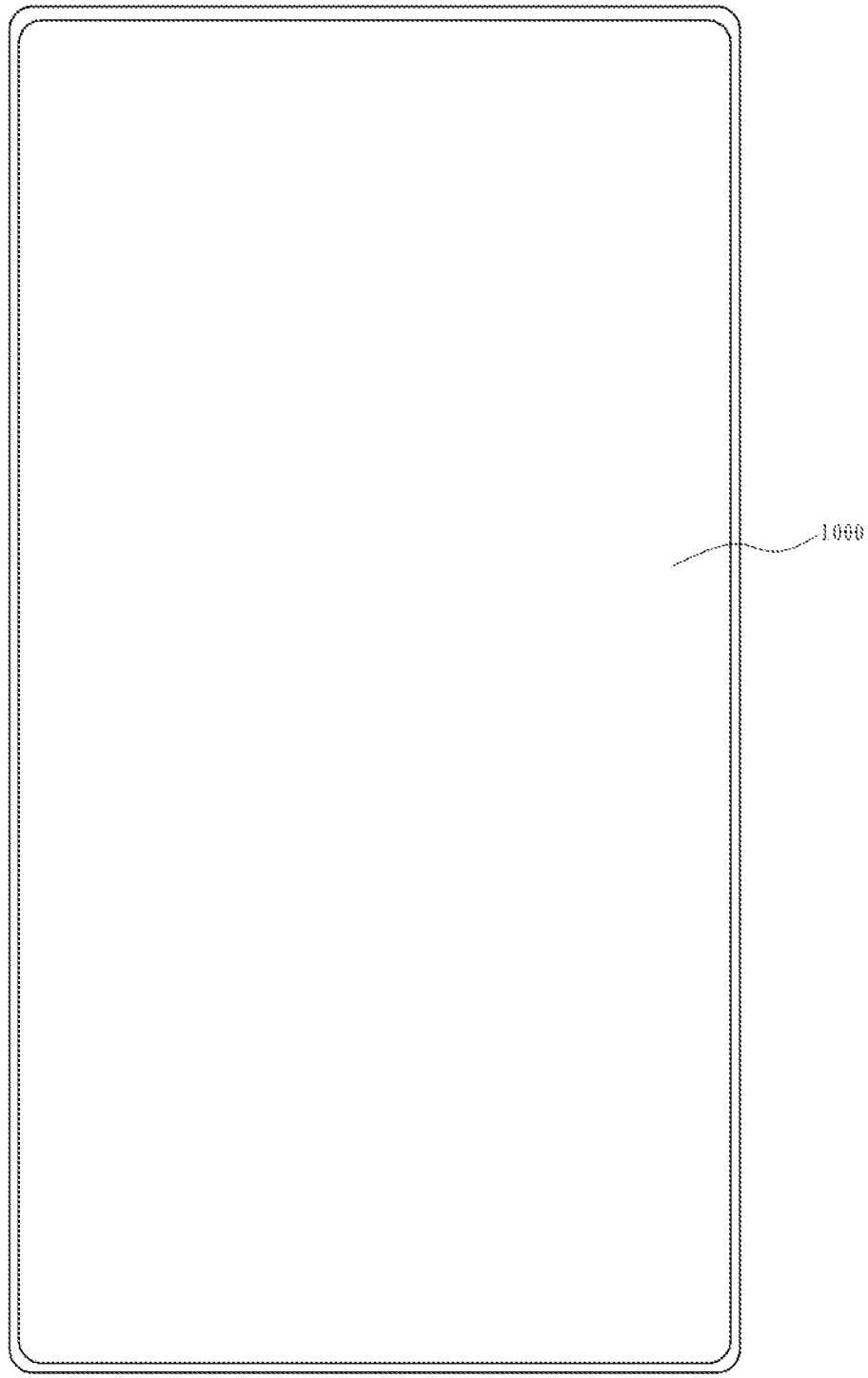
FIG. 21 is a schematic structural diagram of a display device according to an embodiment of the present disclosure.

Referring to FIG. 21, FIG. 21 is a schematic structural diagram of a display device according to an embodiment of the present disclosure. The display device 1000 provided in an embodiment of the present disclosure may be a mobile terminal device.

In other embodiments of the present disclosure, the display device may also be an electronic display device such as a computer and a vehicle-mounted terminal, which will not be limited by the present disclosure.

A display panel and a display device are provided according to the embodiments of the present disclosure. The first main support column and the auxiliary support column are provided between the first substrate and the second substrate in the frame area, and the length of the first main support column is greater than the length of the auxiliary support column. The second substrate includes the base, and further includes the first surface and the second surface which are located on a side of the second substrate facing the first substrate in the frame area. The height from the second surface to the base is greater than the height from the first surface to the base. In the embodiments provided in the present disclosure, the orthographic projection of the first main support column on the base is located within the orthographic projection of the first surface on the base, so that the first main support column is opposite to a concave area of the surface of the second substrate facing the first substrate side. In this way, a situation that a larger cell thickness between the first substrate and the second substrate is formed by the first main support column with a longer length, is improved. Therefore, the high thickness uniformity of the display panel is ensured, the poor display problems, such as yellow display, on the display panel close to a part of the frame area is solved, and the display effect of the display panel is improved.

What is claimed is:

1. A display panel, comprising:
   a first substrate; and
   a second substrate opposite to the first substrate;
   wherein the display panel is divided into a display area and a frame area located at a periphery of the display area;
   wherein a plurality of first main support columns and a plurality of auxiliary support columns are arranged in the frame area, and a length of each of the plurality of first main support columns is greater than a length of each of the plurality of auxiliary support columns in a light emitting direction of the display panel;
   wherein the plurality of first main support columns are located on a side of the first substrate facing the second substrate;
   wherein the second substrate comprises a base, a first surface and a second surface, the first surface and the second surface are located on a side of the second substrate facing the first substrate, and a height from the second surface to the base is greater than a height from the first surface to the base;
   wherein orthographic projections of the plurality of first main support columns on the base are located within an orthographic projection of the first surface on the base;
   wherein the second substrate comprises a planarization layer on a side of the base facing the first substrate, and a wiring layer on a side of the planarization layer facing the first substrate; and
   wherein the wiring layer comprises a plurality of electrode leads in the frame area, orthographic projections of the plurality of electrode leads on the base are located within an orthographic projection of the second surface on the base, and the orthographic projection of the first surface on the base is located within an orthographic projection of a gap between adjacent electrode leads of the plurality of electrode leads on the base.

2. The display panel according claim 1, wherein the wiring layer further comprises at least one transparent conductive layer, and the at least one transparent conductive layer is located on a side of the plurality of electrode leads facing the first substrate and separated from the plurality of electrode leads;
   the at least one transparent conductive layer comprises a plurality of touch electrodes in the display area; and
   the plurality of electrode leads comprises touch electrode leads for connecting the plurality of touch electrodes, in the frame area.

3. The display panel according to claim 1, wherein the plurality of electrode leads comprises a first electrode lead, and a second electrode lead adjacent to the first electrode lead, and the first electrode lead comprises a first straight portion and at least one first winding portion;
   wherein a maximum distance between the first straight portion and the second electrode lead is D1, and a minimum distance between the at least one first winding portion and the second electrode lead is D2, wherein D2 is greater than D1; and
   wherein a first placement area is formed between the at least one first winding portion and the second electrode lead, and an orthographic projection of at least one of the plurality of first main support columns on the base is located within an orthographic projection of the first placement area on the base.

4. The display panel according to claim 3, wherein a plurality of first placement areas are provided between the plurality of electrode leads, and at least part of the plurality of first placement areas does not overlap in an arrangement direction of the plurality of electrode leads.

5. The display panel according to claim 3, wherein the second electrode lead comprises a second straight portion and at least one second winding portion;
   wherein a maximum distance between the second straight portion and an extension line of the first straight portion is D3, and a minimum distance between the at least one second winding portion and the extension line of the first straight portion is D4, wherein D4 is greater than D3; and
   wherein a second placement area is formed between the at least one second winding portion and the first electrode lead, and the orthographic projection of at least one of the plurality of first main support columns on the base is located within an orthographic projection of the second placement area on the base.

6. The display panel according to claim 5, wherein the at least one first winding portion comprises at least one multiplexing first winding portion, the at least one second winding portion comprises at least one multiplexing second winding portion, and the at least one multiplexing first winding portion and the at least one multiplexing second winding portion are arranged oppositely in an arrangement direction of the plurality of electrode leads; and
   wherein a third placement area is formed between the at least one multiplexing first winding portion and the at least one multiplexing second winding portion, and the orthographic projection of at least one of the plurality of first main support columns on the base is located within an orthographic projection of the third placement area on the base.

7. The display panel according to claim 5, wherein the plurality of electrode leads further comprises a third electrode lead, the third electrode lead extends in a straight line in a length extension direction of the third electrode lead, a width of the first electrode lead is greater than a width of the third electrode lead, and a width of the second electrode lead is greater than the width of the third electrode lead.

8. The display panel according to claim 5, wherein the plurality of electrode leads further comprises at least one fourth electrode lead on a side of the first electrode lead facing away from the second electrode lead, the fourth electrode lead comprises a fourth straight portion and at least one fourth winding portion, and the at least one fourth winding portion is arranged around the at least one first winding portion along a contour of the at least one first winding portion; and
   wherein the plurality of electrode leads further comprises at least one fifth electrode lead on a side of the second electrode lead facing away from the first electrode lead, the fifth electrode lead comprises a fifth straight portion and at least one fifth winding portion, and the at least one fifth winding portion is arranged around the at least one second winding portion along a contour of the at least one second winding portion.

9. The display panel according to claim 3, wherein a minimum distance between a contour line of an orthographic projection of one of the plurality of first main support columns on the base and a contour line of an orthographic projection of a winding portion of the one of the plurality of first main support columns on the base ranges from 2 μm to 5 μm, comprising endpoint values.

10. The display panel according to claim 3, wherein at least one connection pattern of the plurality of first main support columns is a grid pattern.

11. The display panel according to claim 1, wherein the first substrate comprises a black matrix;
wherein in the frame area, the first substrate comprises a plurality of first color resist layers on a side of the black matrix facing the second substrate, and the plurality of first main support columns are located on a side of the plurality of first color resist layers facing the second substrate.

12. The display panel according to claim 11, wherein in the frame area, the display panel further comprises at least one first auxiliary support column on a side of at least one of the plurality of first color resist layers facing the second substrate;
wherein in the light emitting direction of the display panel, a length of the at least one first auxiliary support column is less than the length of each of the plurality of first main support columns, the plurality of auxiliary support columns comprises the at least one first auxiliary support column, and an orthographic projection of the at least one first auxiliary support column on the base is located within an orthographic projection of the second surface on the base.

13. The display panel according to claim 12, wherein in the display area, the first substrate comprises a plurality of second color resist layers on the side of the black matrix facing the second substrate, and a display area main support column on a side of the plurality of second color resist layers facing the second substrate;
wherein a length of the display area main support column is greater than or equal to the length of each of the plurality of first main support columns, in the light emitting direction of the display panel; and
wherein a ratio of a density of the at least one first auxiliary support column to a density of the display area main support column is 1:(3~5), comprising endpoint values.

14. The display panel according to claim 13, wherein a thickness of each of the plurality of second color resist layers is less than a thickness of each of the plurality of first color resist layers;
wherein the thickness of each of the plurality of the first color resist layers is T1, the thickness of each of the plurality of the second color resist layers is T2, the length of each of the plurality of first main support columns is L1, and the length of the display area main support column is L2, wherein T1+L1≥T2+L2.

15. The display panel according to claim 14, wherein the height from the first surface to the base is H1, the height from the second surface to the base is H2, and a length of the at least one first auxiliary support column is L3, wherein (T1−T2)+(H2−H1)≥(L2−L3) or (T1−T2)+(H2−H1)<(L2−L3).

16. The display panel according to claim 15, wherein when (T1−T2)+(H2−H1)≥(L2−L3), the display panel comprises at least one second main support column on the side of the black matrix facing the second substrate in the frame area;
wherein in the light emitting direction of the display panel, a length of the at least one second main support column is the same as the length of each of the plurality of first main support columns, and an orthographic projection of the at least one second main support column on the base is located within the orthographic projection of the second surface on the base.

17. The display panel according to claim 11, wherein in the frame area, the display panel further comprises at least one second auxiliary support column on a side of at least one of the plurality of first color resist layers facing the second substrate;
wherein in the light emitting direction of the display panel, a length of the at least one second auxiliary support column is less than the length of each of the plurality of first main support columns, and an orthographic projection of the at least one second auxiliary support column on the base is located within the orthographic projection of the first surface on the base.

18. The display panel according to claim 1, wherein the frame area comprises a step area, and the plurality of first main support columns is located in the step area.

19. A display device, wherein the display device comprises a display panel, and the display panel comprises:
a first substrate; and
a second substrate opposite to the first substrate;
wherein the display panel is divided into a display area and a frame area located at a periphery of the display area;
wherein a plurality of first main support columns and a plurality of auxiliary support columns are arranged in the frame area, and a length of each of the plurality of first main support columns is greater than a length of each of the plurality of auxiliary support columns in a light emitting direction of the display panel;
wherein the plurality of first main support columns are located on a side of the first substrate facing the second substrate;
wherein the second substrate comprises a base, a first surface and a second surface, the first surface and the second surface are located on a side of the second substrate facing the first substrate, and a height from the second surface to the base is greater than a height from the first surface to the base;
wherein orthographic projections of the plurality of first main support columns on the base are located within an orthographic projection of the first surface on the base;
wherein the second substrate comprises a planarization layer on a side of the base facing the first substrate, and a wiring layer on a side of the planarization layer facing the first substrate; and
wherein the wiring layer comprises a plurality of electrode leads in the frame area, orthographic projections of the plurality of electrode leads on the base are located within an orthographic projection of the second surface on the base, and the orthographic projection of the first surface on the base is located within an orthographic projection of a gap between adjacent electrode leads of the plurality of electrode leads on the base.

* * * * *